United States Patent
Iwasaki et al.

(10) Patent No.: US 11,520,227 B2
(45) Date of Patent: Dec. 6, 2022

(54) EJECTION MATERIAL FILLING DEVICE, PRESSURE REGULATION DEVICE, AND EJECTION MATERIAL FILLING METHOD

(71) Applicant: CANON KABUSHIKI KAISHA, Tokyo (JP)

(72) Inventors: Yuichi Iwasaki, Utsunomiya (JP); Yoshimasa Araki, Yokohama (JP); Noriyasu Hasegawa, Utsunomiya (JP); Hideki Matsumoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 152 days.

(21) Appl. No.: 16/855,124

(22) Filed: Apr. 22, 2020

(65) Prior Publication Data

US 2020/0341371 A1  Oct. 29, 2020

(30) Foreign Application Priority Data

Apr. 26, 2019 (JP) .................................. 2019-085561

(51) Int. Cl.
*G03F 7/00* (2006.01)

(52) U.S. Cl.
CPC .................................. *G03F 7/0002* (2013.01)

(58) Field of Classification Search
CPC ..... G03F 7/0002; B41J 2/175; B41J 2/17566; B41J 2/20; B41J 2002/17516; B29C 59/16; B29L 2031/7678; Y10T 137/0396; F04B 43/02; B05C 11/1002

See application file for complete search history.

(56) References Cited

U.S. PATENT DOCUMENTS

| | | | |
|---|---|---|---|
| 9,952,506 B2 * | 4/2018 | Arai | G03F 7/0002 |
| 2011/0014619 A1 | 1/2011 | Araki | 435/6.19 |
| 2015/0097900 A1 * | 4/2015 | Araki | B41J 2/17566 264/293 |
| 2016/0375459 A1 * | 12/2016 | deVilliers | H01L 28/00 700/231 |
| 2017/0326583 A1 * | 11/2017 | Ito | B05C 11/10 |
| 2018/0244047 A1 * | 8/2018 | Muto | B41J 2/025 |

FOREIGN PATENT DOCUMENTS

| | | | | |
|---|---|---|---|---|
| JP | 2015066842 A | * | 4/2015 | ............. B41J 2/055 |
| JP | 2018-160684 A | | 10/2018 | |

* cited by examiner

*Primary Examiner* — Michael M. Robinson
*Assistant Examiner* — Victoria Bartlett
(74) *Attorney, Agent, or Firm* — Venable LLP

(57) ABSTRACT

An ejection material filling device fills an ejection material into a first storage space of an ejection material ejecting device including an ejection head configured to eject the ejection material and a storage container having an internal space separated by flexible membrane into the first storage space storing the ejection material and a second storage space storing a hydraulic fluid. The ejection material filling device includes an ejection material server bottle storing the ejection material to be filled into the first storage space, pipes configured to form a circulation path including the ejection material server bottle and the first storage space, a pump configured to circulate the ejection material through the circulation path, and a particle filter provided in the circulation path.

21 Claims, 6 Drawing Sheets

EJECTION MATERIAL FILLING DEVICE, PRESSURE REGULATION DEVICE, AND EJECTION MATERIAL FILLING METHOD

BACKGROUND OF THE DISCLOSURE

Field of the Disclosure

The present disclosure relates to an ejection material filling device, a pressure regulation device, and an ejection material filling method.

Description of the Related Art

There is an ejection material ejecting device configured to eject a liquid or an ejection material in a liquid state stored in a storage container from an ejection head. Japanese Patent Laid-Open No. 2018-160684 discloses an imprint apparatus using a liquid containing unit partitioned by a flexible member into two storage spaces. A first storage space of the liquid storage unit stores a first liquid that is an ejection material and a second storage space stores a second liquid. The internal pressure of the first storage space is indirectly regulated by controlling the internal pressure of the second storage space.

In Japanese Patent Laid-Open No. 2018-160684, since the volume of the first storage space is changed by the flexible member, there is a possibility that the amount of ejection material filled into the first storage space is less than a desired amount. There is also a possibility that the ejection material filled into the first storage space contains impurities.

SUMMARY OF THE DISCLOSURE

The present disclosure aims to fill an ejection material suitably into an ejection material storage container of an ejection material ejecting device.

An ejection material filling device according to this disclosure is an ejection material filling device configured to fill an ejection material into a first storage space of an ejection material ejecting device comprising an ejection head comprising an ejection opening configured to eject the ejection material and a storage container comprising an internal space separated by flexible membrane into the first storage space storing the ejection material and a second storage space storing a hydraulic fluid, the ejection material filling device comprising a tank storing the ejection material to be filled into the first storage space, one or more pipes configured to form a circulation path including the tank and the first storage space, a liquid delivery unit configured to circulate the ejection material through the circulation path, and a filter provided in the circulation path.

DESCRIPTION OF THE EMBODIMENTS

Exemplary embodiments will be hereinafter described in detail with reference to the attached drawings.

First Embodiment

Figure 1:
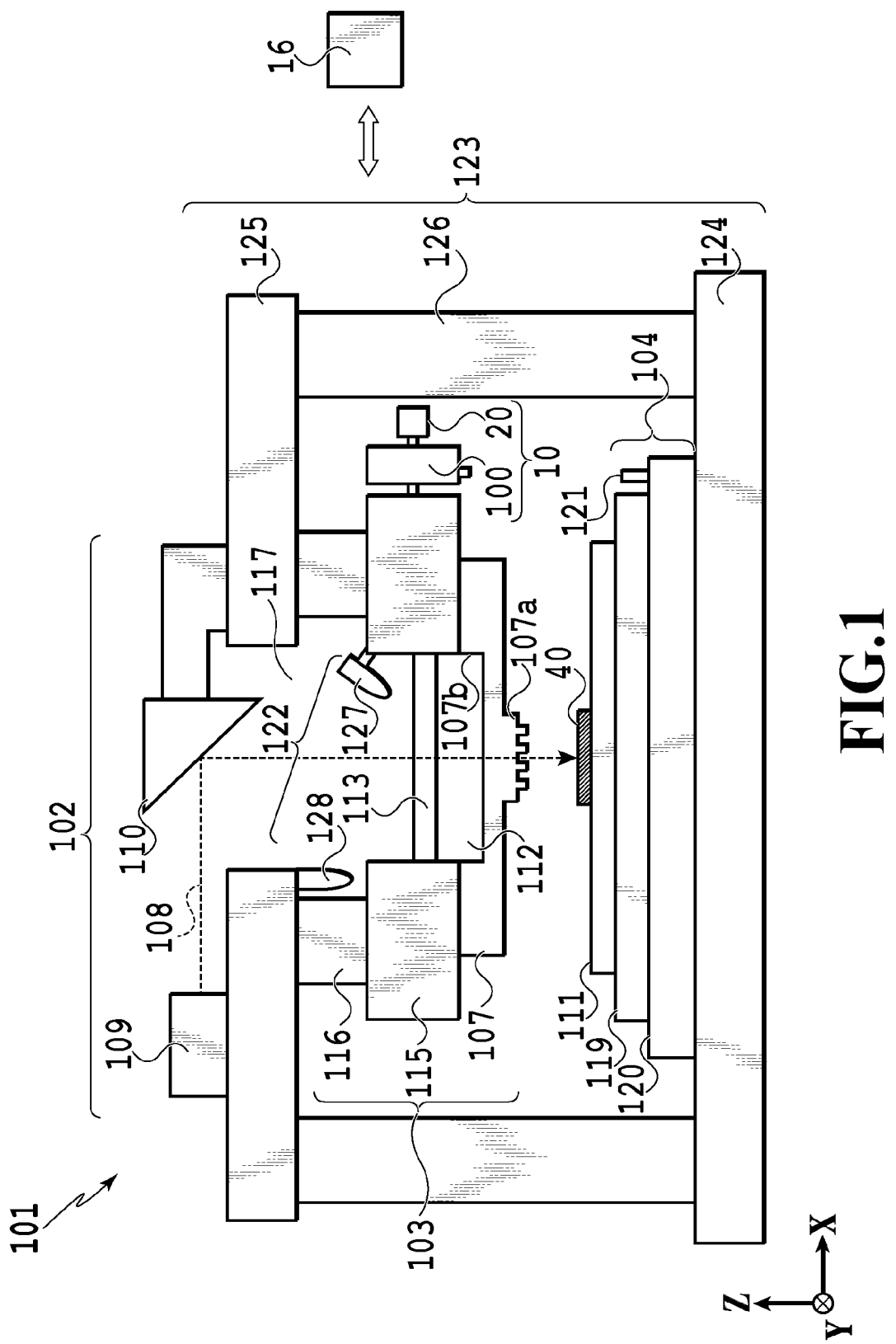
FIG. 1 is a diagram showing a configuration of an imprint apparatus.

[Imprint Apparatus]
FIG. 1 is a schematic diagram showing a configuration of an imprint apparatus. An imprint apparatus 101 is used to manufacture various devices such as a semiconductor device. An uncured resin (also referred to as a resist or an imprint material) 40 is applied to a substrate 111. The uncured resin 40 is ejected by an ejection material ejecting device 10 to be described later and is therefore also referred to as an ejection material. The imprint apparatus 101 presses a mold 107 having a pattern for molding against the uncured resist 40 and cures the resist 40 in this state by light (ultraviolet light) irradiation. After that, the mold 107 is removed from the cured resist 40, whereby the imprint apparatus 101 performs imprint processing of transferring the pattern of the mold 107 to the substrate 111.

The resist 40 is a photo-curable resin having the property of being cured by receiving ultraviolet light 108. The resist is appropriately selected depending on various conditions such as a semiconductor device manufacturing process. Instead of the photo-curable resist, for example, a thermosetting resist may be used and the imprint apparatus may perform imprint processing by curing the resist by heat.

The imprint apparatus 101 comprises a light irradiating unit 102, a mold holding mechanism 103, a substrate stage 104, the ejection material ejecting device 10, a control unit 16, a measuring unit 122, and a housing 123.

The light irradiating unit 102 comprises a light source 109 and an optical element 110 for correcting the ultraviolet light 108 emitted from the light source 109. For example, the light source 109 is a halogen lamp configured to generate i-line or g-line. The resist 40 is irradiated with the ultraviolet light 108 via a mold 107. The wavelength of the ultraviolet light 108 depends on the resist 40 to be cured. In a case where the imprint apparatus uses a thermosetting resist as the resist, the light irradiating unit 102 is replaced with a heat source for curing the thermosetting resist.

The mold holding mechanism 103 comprises a mold chuck 115 and a mold driving mechanism 116. The mold 107 held by the mold holding mechanism 103 has a rectangular outer shape. A surface of the mold 107 facing the substrate 111 comprises a pattern portion 107a in which an uneven pattern to be transferred such as a circuit pattern is three-dimensionally formed. In the present embodiment, the mold 107 is formed of a material that allows the ultraviolet light 108 to pass through. For example, quartz is used as the material.

The mold chuck 115 holds the mold 107 by vacuum suction or electrostatic force. The mold driving mechanism 116 moves the mold 107 by holding and moving the mold chuck 115. The mold driving mechanism 116 can move the mold 107 in a −Z direction to press the mold 107 against the resist 40. The mold driving mechanism 116 can also move the mold 107 in a Z direction to remove the mold 107 from the resist 40. An actuator usable as the mold driving mechanism 116 is, for example, a linear motor or an air cylinder.

The mold chuck 115 and the mold driving mechanism 116 have an opening region 117 at the center. A surface of the mold 107 irradiated with the ultraviolet light 108 has a cavity 107b of a recessed shape. In the opening region 117 of the mold driving mechanism 116, a light transmissive member 113 is provided. The light transmissive member 113, the cavity 107b, and the opening region 117 form a sealed space 112. A pressure in the space 112 is controlled by a pressure correction device (not shown). The pressure correction device sets the pressure in the space 112 to be higher than the external pressure, whereby the pattern portion 107a is warped toward the substrate 111. This brings the center of the pattern portion 107a into contact with the resist 40. Thus, in the case of pressing the mold 107 against the resist 40, gas (air) can be prevented from being trapped between the pattern portion 107a and the resist 40, with the result that the uneven portion of the pattern portion 107a can be completely filled with the resist 40. The depth of the cavity 107b, which determines the size of the space 112, is appropriately changed according to the size or material of the mold 107.

The substrate stage 104 comprises a substrate chuck 119, a substrate stage housing 120, and a stage reference mark 121.

The substrate 111 held by the substrate stage is a monocrystalline silicon substrate or a silicon on insulator (SOI) substrate. The resist 40 is applied to a surface to be treated of the substrate 111 and the pattern is molded thereon.

The substrate chuck 119 holds the substrate 111 by vacuum suction. The substrate stage housing 120 moves the substrate 111 by moving the substrate chuck 119 in X and Y directions while holding the substrate chuck 119 using mechanical means. The stage reference mark 121 is used to set a reference position of the substrate 111 in alignment of the substrate 111 and the mold 107 before the mold 107 contacts the resist 40 on the substrate 111. An actuator of the substrate stage housing 120 is, for example, a linear motor.

The ejection material ejecting device 10 (hereinafter referred to as the ejecting device) is a device configured to eject the uncured resist 40 as the ejection material and apply the resist on the substrate 111. The ejecting device 10 comprises an ejection material storage unit 100 and a pressure control unit 20 configured to control a pressure in a storage container of the ejection material storage unit 100. The ejection material storage unit 100 comprises a storage container 13 (see FIG. 2) storing the ejection material and an ejection head 14 (see FIG. 2) mounted on the storage container. The ejecting device 10 is attachable to and detachable from the imprint apparatus 101. In a case where the ejection material stored in the storage container 13 is consumed, the ejection material storage unit 100 mounted on the ejecting device 10 can be replaced with another ejection material storage unit storing the ejection material. The configuration of the ejecting device 10 will be described later in detail.

The measuring unit 122 comprises an alignment measuring instrument 127 and an observation measuring instrument 128. The alignment measuring instrument 127 measures a misalignment of the alignment mark formed on the substrate 111 and an alignment mark formed on the mold 107 in the X and Y directions. The observation measuring instrument 128 is an image capturing device such as a CCD camera and is configured to capture an image of the pattern of the resist 40 applied to the substrate 111 and output the image to the control unit 16 as image information.

The control unit 16 controls operation or the like of each constituent element of the imprint apparatus 101. The control unit 16 is, for example, a computer comprising a CPU, a ROM, and a RAM. The control unit 16 is connected to each constituent element of the imprint apparatus 101 via a circuit. The CPU controls each constituent element according to a control program stored in the ROM.

The control unit 16 controls operation of the mold holding mechanism 103, the substrate stage 104, and an ejection unit 105 based on measurement information of the measuring unit 122. The control unit 16 may be integrated with a different unit in the imprint apparatus 101 or may be implemented as a device separate from the imprint apparatus. The control unit 16 is not necessarily a single computer and may include a plurality of computers.

The housing 123 comprises a base surface plate 124 on which the substrate stage 104 is placed, a bridge surface plate 125 fixing the mold holding mechanism 103, and a strut 126 extending from the base surface plate 124 and supporting the bridge surface plate 125.

Next, imprint processing by the imprint apparatus 101 will be described. The control unit 16 causes a substrate conveying mechanism (not shown) to place the substrate 111 on the substrate chuck 119. After the substrate 111 is placed on the substrate chuck 119, the control unit 16 fixes the substrate 111 on the substrate chuck 119. The control unit 16 then moves the substrate stage 104 to a position in which the ejecting device 10 can eject the resist 40 on the substrate 111. Next, the control unit 16 generates a drive signal. Based on the drive signal, the ejecting device 10 applies the resist 40 to a pattern formation region on the substrate 111. Next, the control unit 16 moves the substrate stage 104 such that the pattern formation region on the substrate 111 is positioned directly below the pattern portion 107a. Next, the control unit 16 drives the mold driving mechanism 116 to press the mold 107 against the resist 40 on the substrate 111. Through this mold pressing process, the uneven portion of the pattern portion 107a is filled with the resist 40. In this state, the control unit 16 causes the light irradiating unit 102 to emit the ultraviolet light 108 from the top surface of the mold 107 to cure the resist 40. After the resist 40 is cured, the control unit 16 drives the mold driving mechanism 116 again to remove the mold 107 from the resist 40. By removing the mold 107, a three-dimensional pattern of the resist 40 corresponding to the uneven portion of the pattern portion 107a is formed on the substrate 111.

In the imprint processing, patterns are often formed on the entire region of the substrate 111. In this case, the control unit 16 moves the substrate stage 104, changes the pattern formation region, and performs the above series of operation multiple times, thereby molding a plurality of patterns of the resist 40 on the single substrate 111.

[Configuration of Ejection Material Ejecting Device]

Figure 2:
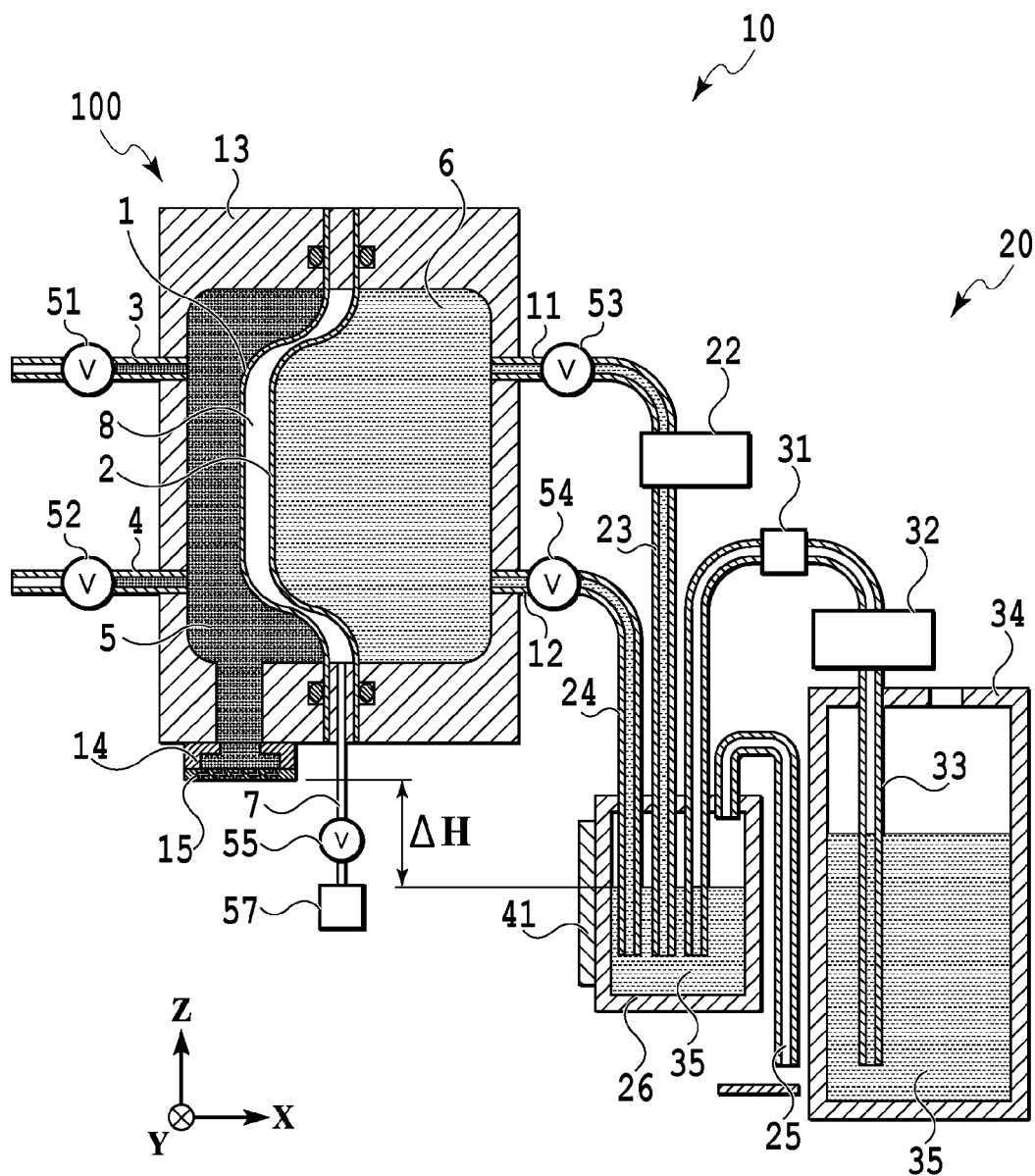
FIG. 2 is a diagram showing a configuration of an ejection material ejecting device.

FIG. 2 is a schematic diagram of a configuration of the ejecting device 10. The pressure control unit 20 of the ejecting device 10 of the present embodiment comprises a main tank 34 storing a hydraulic fluid 35 in its interior communicating with the atmosphere and a sub-tank 26 storing the hydraulic fluid 35 in its interior communicating with the atmosphere and capable of communicating with the main tank 34. The ejection material storage unit 100 of the ejecting device 10 comprises a storage container 13 storing the ejection material and an ejection head 14 mounted on the storage container 13. In the present embodiment, the ejection material is the uncured resist 40. The storage container 13 and the ejection head 14 may be formed either separately or integrally. The storage container 13 may be of a cartridge type. The ejecting device 10 of the present embodiment further comprises an intermembrane pressure regulation device 57.

[Configuration of Ejection Head]

Figure 3:
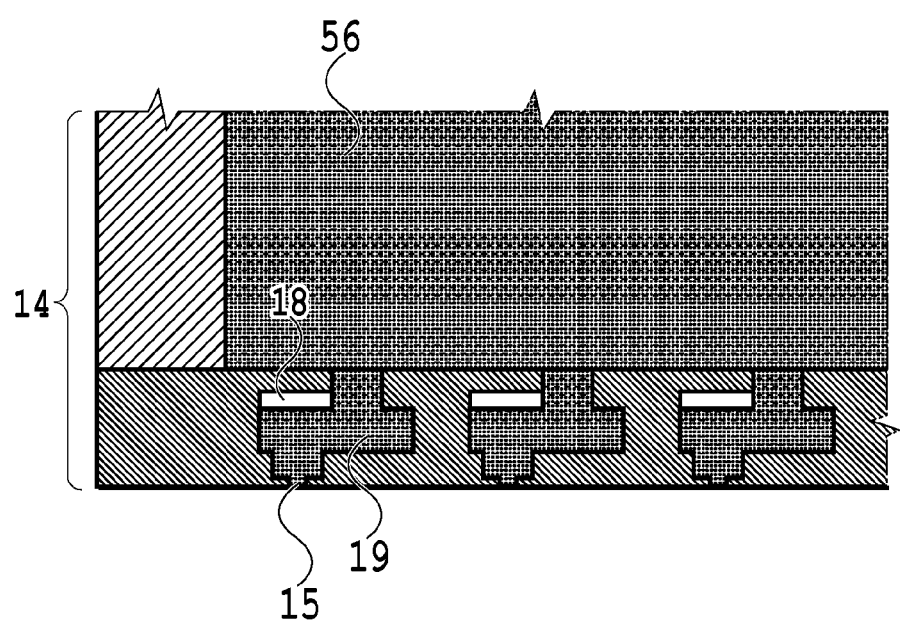
FIG. 3 is an enlarged view of an ejection head.

FIG. 3 is an enlarged view of the vicinity of ejection openings 15 in the ejection head 14. The ejection head 14 can eject the ejection material from the ejection openings 15 which open on an external surface (ejection surface) of the ejection head. The ejection openings 15 of the present embodiment are provided on the ejection surface of the ejection head 14 at the density of from 500 to 1,000 per inch.

In the ejection head 14, an energy generating element 18 is mounted in a pressure chamber 19 provided corresponding to each of the ejection openings 15. The energy generating element 18 may be any element capable of generating energy for ejecting the ejection material as a fine droplet such as a droplet of 1 pL (picolitre) and may be, for example, a piezoelectric element or a heating resistance element. In the case of using a piezoelectric element, since a temperature change (temperature rise) less affects the ejection characteristics as compared with the case of using a heating resistance element, the element can be used at high temperatures. This enables the use of a variety of ejection materials such as a resin with a high viscosity. In the case of using a heating resistance element, manufacturing costs can be generally relatively low. The energy generating element 18 of the present embodiment is a piezoelectric element and the ejection material is ejected from the pressure chamber 19 through the ejection opening 15 by performing drive control of the piezoelectric element and changing the volume of the pressure chamber 19. The piezoelectric element may be mounted using the micro electro mechanical systems (MEMS) technology.

Each pressure chamber 19 communicates with a common liquid chamber 56. The common liquid chamber 56 communicates with a first storage space 5 of the storage container 13. The ejection material to be ejected from the ejection openings 15 is supplied from the first storage space 5 to the pressure chambers 19 through the common liquid chamber 56. Since there is no control valve between the ejection head 14 and the first storage space 5, the internal pressure of the first storage space 5 is controlled to be slightly more negative than the atmospheric pressure (external pressure) outside the ejection openings 15 of the ejection head 14. This negative pressure control forms a meniscus at an interface between the ejection material in the ejection opening 15 and the outside air and prevents leakage (dropping) of the ejection material from the ejection opening at an unintended timing. In the present embodiment, the internal pressure of the first storage space 5 is controlled to be more negative than the external pressure by 0.40±0.04 kPa.

[Pressure Relationship Between First Storage Space and Second Storage Space]

In the case of a difference in internal pressure between the first storage space 5 and the second storage space 6, a first film 1 and a second film 2 each having flexibility repeat the movement of moving to the lower internal pressure side and stopping moving upon disappearance of the difference in internal pressure. Thus, the internal pressures of the first storage space 5 and the second storage space 6 can be kept equal to each other.

More specifically, in a case where the ejection material is ejected from the ejection head 14, the volume of the ejection material in the first storage space 5 is reduced by the volume of the ejection material ejected and the internal pressure of the first storage space 5 decreases. At this time, the internal pressure of the second storage space 6 is relatively higher than the internal pressure of the first storage space 5. An intermembrane space 8 between the flexible first film 1 and second film 2 is controlled to have a more negative pressure than the internal pressure of the first storage space 5 or the pressure of the second storage space 6, as will be described later. Thus, in response to a decrease in the internal pressure of the first storage space 5, the first film 1 and the second film 2 integrally move toward the first storage space 5. At the same time, the hydraulic fluid 35 is sucked from the sub-tank 26 into the second storage space 6 through a pipe 24 and a hydraulic fluid pipe 12. This equalizes the internal pressures of the first storage space 5 and the second storage space 6 again and brings them into a state of equilibrium.

As shown in FIG. 2, since the sub-tank 26 communicates with the outside through a pipe 25, the internal pressure of the sub-tank 26 is equal to the atmospheric pressure. The pipe 24 through which the sub-tank 26 communicates with the second storage space 6 is filled with the hydraulic fluid 35 and a liquid surface position in the vertical direction (hereinafter also referred to as "liquid surface height") of the hydraulic fluid 35 in the sub-tank 26 is set to a position lower than the ejection openings 15 of the ejection head 14. A difference in height (distance in the vertical direction) between the liquid surface position of the hydraulic fluid 35 in the sub-tank 26 and the position of the ejection surface on which the ejection openings 15 open is represented by ΔH. In the present embodiment, the difference ΔH is set so as to maintain a state in which the meniscus of the ejection material is formed in each ejection opening 15. In other words, the difference ΔH is set so as to prevent the ejection material from externally leaking or dropping from the ejection openings 15 and prevent the meniscuses from being excessively drawn toward the recess (for example, the vicinity of the common liquid chamber). More specifically, the difference in height ΔH is set to 41±4 mm so as to control the internal pressure of the first storage space 5 to a value lower than the external pressure by 0.40±0.04 kPa. The difference in height ΔH can be set as appropriate.

[Configuration of Pressure Control Unit]

Next, the pressure control unit 20 will be described. In the pressure control unit 20, correction operation is performed in a case where the liquid surface height of the hydraulic fluid in the sub-tank 26 is out of a predetermined range with respect to a reference liquid surface height. In the case of the above example, correction operation is performed in a case where the liquid surface height of the hydraulic fluid in the sub-tank 26 is out of a predetermined range (reference liquid surface height±4 mm) with respect to a reference liquid surface height (height lower than the ejection opening 15 by 41 mm). The correction operation is the operation of "liquid surface adjustment" of moving the hydraulic fluid between the main tank 34 and the sub-tank 26 such that the liquid surface height of the hydraulic fluid in the sub-tank 26 falls within the predetermined range.

The sub-tank 26 is provided with a liquid surface sensor 41. The liquid surface sensor 41 of the present embodiment is a sensor capable of sensing the liquid surface height of the hydraulic fluid in the sub-tank 26 and a change (displacement) in the liquid surface height. The main tank 34 and the sub-tank 26 can communicate with each other through a pipe 33 comprising a control valve 31 and a pump 32. The control unit 16 drives the control valve 31 and the pump 32 and controls the liquid surface height of the hydraulic fluid in the sub-tank 26 within a desired range (that is, performs liquid surface adjustment). More specifically, in a case where the liquid surface sensor 41 senses that the liquid surface height of the hydraulic fluid 35 in the sub-tank 26 becomes lower than the predetermined range, the control valve 31 is opened and the pump 32 is driven to supply the hydraulic fluid from the main tank 34 to the sub-tank 26. In a case where the liquid surface sensor 41 senses that the liquid surface height of the hydraulic fluid 35 in the sub-tank 26 is within the predetermined range, the drive of the pump 32 is stopped and the control valve 31 is closed to stop supplying the hydraulic fluid from the main tank 34 to the sub-tank 26. The hydraulic fluid can also be returned from the sub-tank 26 to the main tank 34 by controlling the control valve 31 and the pump 32. In this manner, the liquid surface height in the sub-tank 26 is maintained within the predetermined range.

It is preferable that the sub-tank 26 be arranged such that an inner ceiling surface (the uppermost portion in the vertical direction) of the sub-tank 26 is lower than the ejection openings 15 of the ejection head 14 in the vertical direction. This arrangement prevents the liquid surface position of the hydraulic fluid 35 in the sub-tank 26 from becoming higher than the position of the ejection surface of the ejection opening 15 even in a case where the hydraulic fluid is supplied from the main tank 34 by the liquid surface adjustment described above until the sub-tank 26 is filled up. That is, since the ceiling surface of the sub-tank 26 limits the liquid surface height of the hydraulic fluid 35 in the sub-tank 26, the relative positional relationship in the vertical direction (height relationship) between the liquid surface of the hydraulic fluid 35 and the ejection openings is maintained and the difference in height ΔH never becomes 0 (zero). Therefore, the internal pressures of the first storage space 5 and the second storage space 6 can be kept more negative than the external pressure and the ejection material can be prevented from leaking and dropping from the ejection openings 15.

The second storage space 6 and the sub-tank 26 can also communicate with each other through a pipe 23 comprising a pump 22 and a hydraulic fluid pipe 11 as well as through the pipe 24 and the hydraulic fluid pipe 12. In a case where the storage container 13 is detached from the ejecting device 10 once and is attached thereto again, there is a possibility that a bubble enters into the pipe 24. In this case, valves 53 and 54 are opened and the pump 22 is activated to circulate the hydraulic fluid 35 through the pipe 24, the hydraulic fluid pipe 12, the second storage space 6, the hydraulic fluid pipe 11, and the pipe 23. The bubble can be removed from the pipe 24 by conveying the hydraulic fluid to the sub-tank 26. The valves 53 and 54 are closed in a case where the pump 22 is not used and opened in a case where the pump 22 is used.

For example, the pumps 22 and 32 may be syringe pumps, tube pumps, diaphragm pumps, or gear pumps. However, the pumps 22 and 32 are not limited to pumps as long as they have the function of liquid delivery units. Liquid delivery units suitable for the ejection material ejecting device can be selected as the pumps 22 and 32.

The hydraulic fluid is an incompressible substance that is negligibly changed in density (volume) by external temperature and pressure as compared with gas. Accordingly, even in the case of a change in the atmospheric temperature or pressure around the ejecting device 10, the volume of the hydraulic fluid hardly changes. As the hydraulic fluid, for example, a substance selected from liquids such as water and gel substances can be used. In general, a difference in density between the ejection material and the hydraulic fluid is less than a difference in density between the ejection material and gas.

[Storage Container]

The internal space of the storage container 13 is separated into the first storage space 5 and the second storage space 6 by flexible membrane including the first film 1 and the second film 2 which function as diaphragms. An intermembrane space 8 is formed between the first storage space 5 and the second storage space 6 (that is, between the first film 1 and the second film 2). Since the intermembrane space 8 is formed, the ejection material and the hydraulic fluid can be prevented from being mixed even in the case of breakage of the first film 1.

An intermembrane exhaust pipe 7 communicating with the intermembrane space 8 is connected to an intermembrane pressure regulation device 57. The intermembrane pressure regulation device 57 can suck gas (air) in the intermembrane space 8, maintain the intermembrane space 8 at a pressure more negative than the internal pressure of the first storage space 5 or the second storage space 6, and bring the first film 1 and the second film 2 at least partially into intimate contact with each other. As a result, the first film 1 and the second film 2 can be integrally deformed and moved in conjunction with each other. Accordingly, by performing the liquid surface adjustment of the sub-tank 26, the internal pressure of the second storage space 6 is controlled and the internal pressure of the first storage space 5 is indirectly controlled.

The storage container 13 comprises filling pipes 3 and 4, the hydraulic fluid pipes 11 and 12, and an intermembrane exhaust pipe 7. The filling pipes 3 and 4, the hydraulic fluid pipes 11 and 12, and the intermembrane exhaust pipe 7 are equipped with valves 51 to 55 for sealing the pipes, respectively.

The hydraulic fluid pipe 11 and the pipe 23 of the pressure control unit 20 are connected to each other via respective connecting units. The hydraulic fluid pipe 12 and the pipe 24 of the pressure control unit 20 are connected via respective connecting units and communicate with each other. The intermembrane pressure regulation device 57 and the intermembrane exhaust pipe 7 are connected via respective connecting units and communicate with each other. The connection in each connecting unit is dissolvable and the intermembrane pressure regulation device 57 and the pressure control unit 20 can be detached from the storage container 13 of the ejection material storage unit 100.

As the connecting units, the hydraulic fluid pipes 11 and 12 and the intermembrane exhaust pipe 7 may be provided with couplers each having a sealing mechanism that is sealed upon detachment. In this case, the pipes 23 and 24 and the intermembrane pressure regulation device 57 are also provided with couplers as the connecting units such that the intermembrane pressure regulation device 57 and the pressure control unit 20 are detachably connected to the storage container 13 via the respective couplers. The couplers each having a sealing mechanism may be provided instead of the valves 53 to 55.

Figure 4:
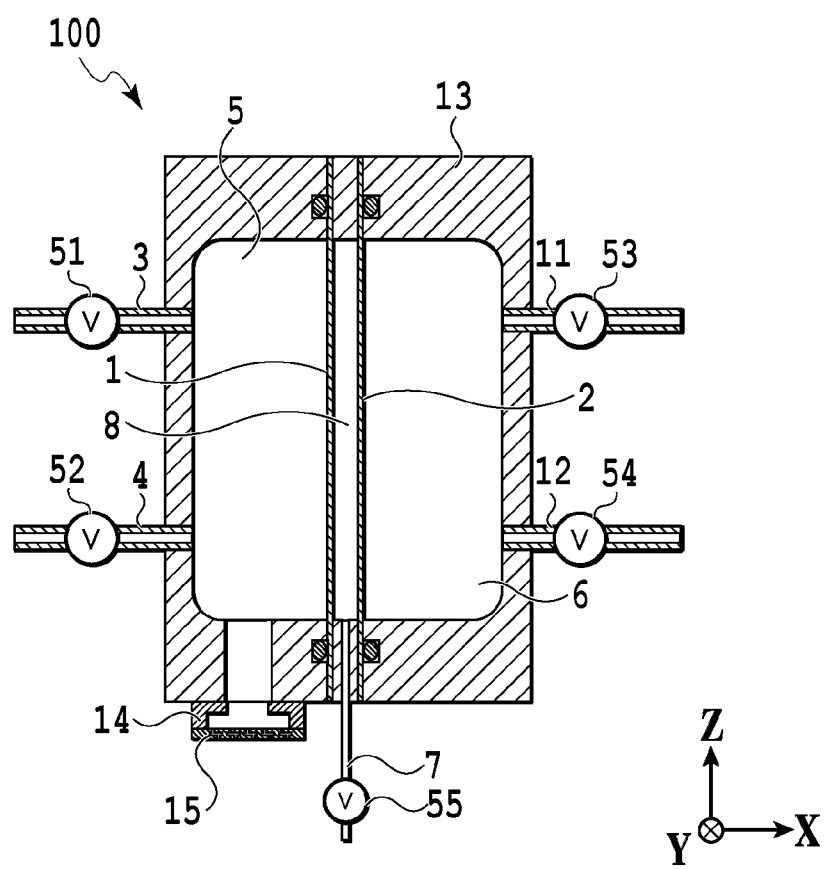
FIG. 4 is a diagram showing a configuration of an ejection material storage unit.

FIG. 4 is a diagram showing the ejecting device 10 after detachment of the ejection material storage unit 100. As shown in FIG. 4, the ejection material storage unit 100 can be detached from the ejecting device 10 to deliver only the ejection material storage unit 100 for the purpose of filling the ejection material or the like. In a case where the intermembrane pressure regulation device 57 is detached from the intermembrane exhaust pipe 7, air often enters into the intermembrane space 8. Further, in a case where the storage container 13 does not store the ejection material, the pressure of the storage container 13 does not need to be more negative than the external atmospheric pressure (external pressure). Therefore, in the case of delivering the storage container 13 not storing the ejection material, the delivery is often made with the pressure of the intermembrane space 8 equal to the atmospheric pressure.

[Ejection Material Filling Device and Intermembrane Pressure Regulation Device]

Figure 5:
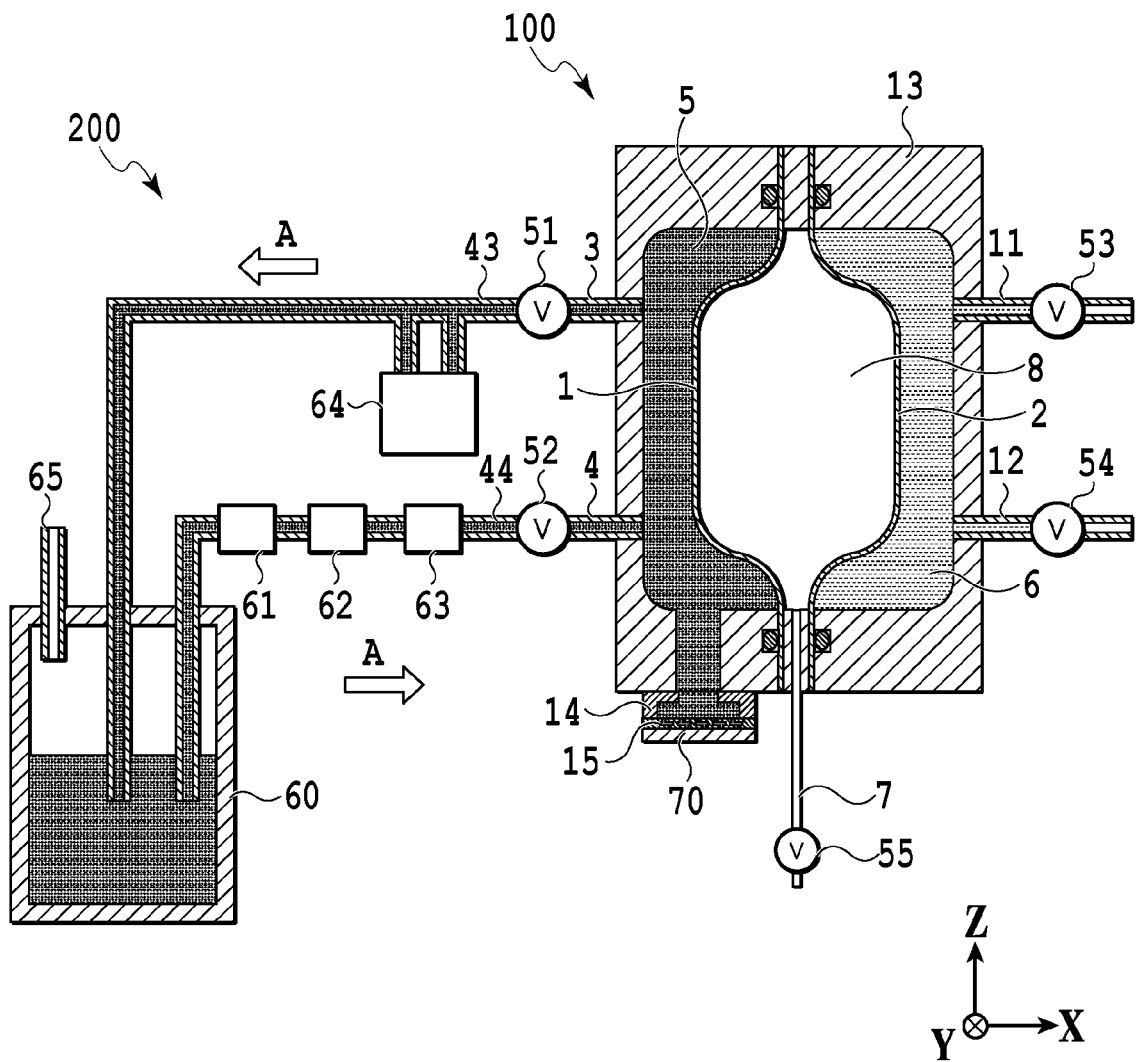
FIG. 5 is a diagram showing a comparative example of filling an ejection material.

FIG. 5 is a diagram showing a comparative example in the case of filling the ejection material by using an ejection material filling device 200 (hereinafter referred to as a filling device). As described above, the intermembrane space 8 is formed in the storage container 13 of the present embodiment. The volume of the first storage space 5 is reduced in a case where air enters into the intermembrane space 8 and the intermembrane space 8 is expanded. For example, during filling of the ejection material by the filling device 200, the pressures of the first storage space 5 and the second storage space 6 are often regulated to pressures more negative than the atmospheric pressure in order to prevent leakage and dropping of the ejection material from the ejection opening 15. In this case, the intermembrane space 8 is expanded if the pressure of the intermembrane space 8 is substantially equal to the atmospheric pressure during filling of the ejection material. In a case where the intermembrane space 8 is expanded during filling of the ejection material, the volume of the first storage space 5 is reduced as shown in FIG. 5 and the filling amount of ejection material becomes less than a predetermined amount. Thus, in the present embodiment, an intermembrane pressure regulation device 66 for filling the ejection material without expanding the intermembrane space 8 will be described.

Further, in a case where a pattern is formed by bringing the mold 107 into contact with the resist on the substrate 111 with particles adhering to the mold 107 or the substrate 111, a pattern having deficiency may be formed or the substrate 111 or the mold 107 may be damaged. For this reason, it is necessary to exclude particles from the ejection material to be filled. A filling device configured to fill the ejection material without including particles will be described.

Figure 6:
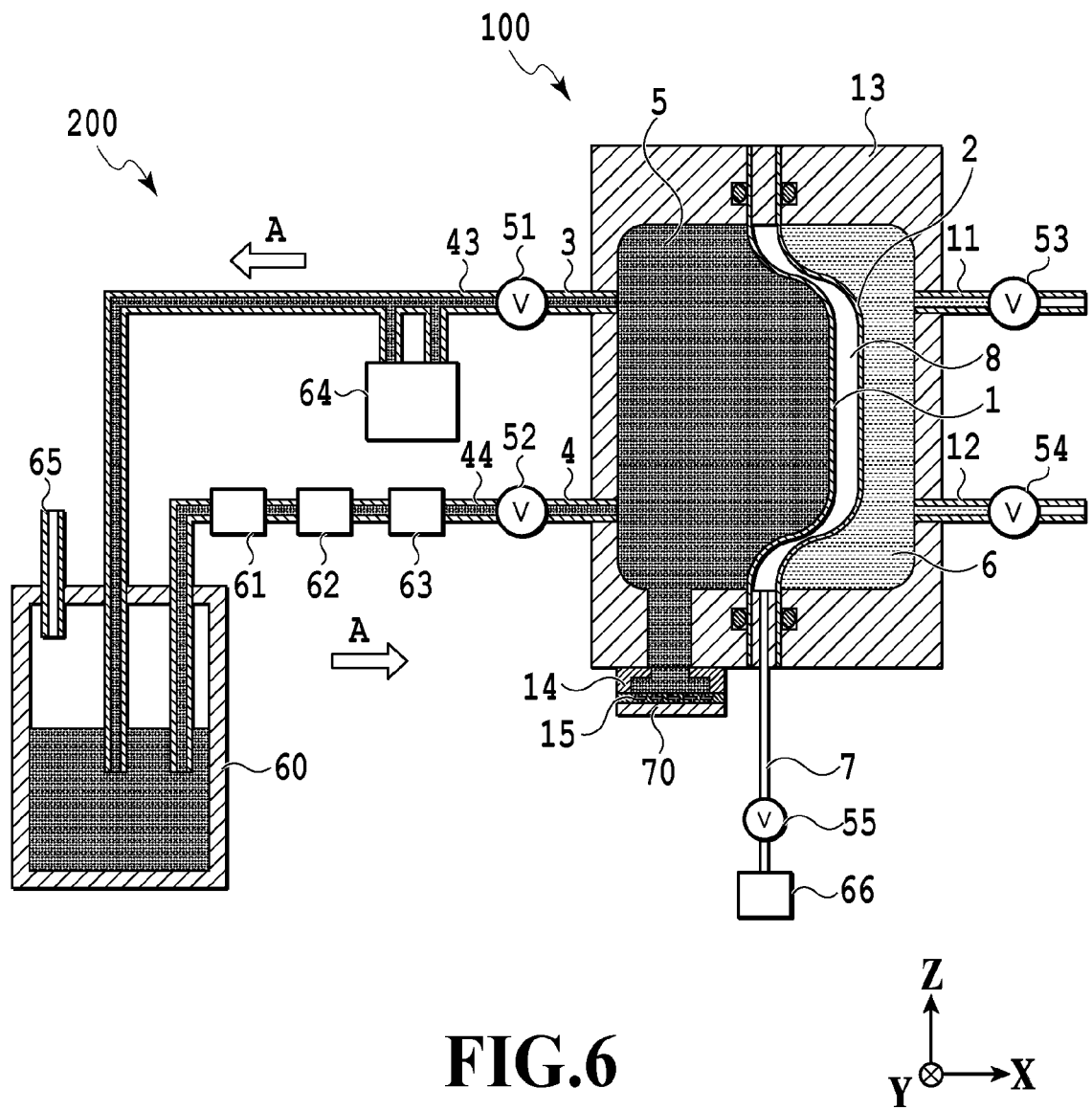
FIG. 6 is a diagram showing a configuration of an ejection material filling device and an intermembrane pressure regulation device.

FIG. 6 is a diagram showing the filling device 200 and the intermembrane pressure regulation device 66 of the present embodiment. The filling device 200 of the present embodiment comprises an ejection material server bottle 60, a pump 61, a deaeration unit 62, a particle filter 63, and a particle counter 64. The filling device 200 is a device configured to fill the ejection material into the first storage space 5 of the ejecting device 10.

Each unit of the filling device 200 is resistant to the ejection material and hardly causes metal elution or generate particles. For example, it is preferable that the pump 61 be a diaphragm pump and the material for the particle filter 63 be polyethylene. Depending on particles, two or more particle filters 63 may be coupled and filtering sizes may be freely combined like 5 nm+20 nm.

The filling pipe 3 and the pipe 43 of the filling device 200 is connected via respective connecting units to communicate with each other. Similarly, the filling pipe 4 and the pipe 44 of the filling device 200 is connected via respective connecting units to communicate with each other.

The filling device 200 communicating with the first storage space 5 of the ejecting device 10 can fill the ejection material in the ejection material server bottle 60 into the first storage space 5 of the ejecting device 10 by opening valves 51 and 52 and activating the pump 61. The pipes 43 and 44 of the filling device 200 form a circulation path including the first storage space 5 and the ejection material server bottle 60. Therefore, by activating the pump 61, the ejection material can be circulated through the circulation path through which the ejection material flows in the order of the ejection material server bottle 60, the pipe 44, the filling pipe 4, the first storage space 5, the filling pipe 3, and the pipe 43.

The pipe 44 of the filling device 200 is provided with the particle filter 63. Thus, particles included in the ejection material in the ejection material server bottle 60 can be filtered out through the particle filter 63 by circulating the ejection material through the circulation path. Further, as shown in FIG. 6, the pipe 44 of the filling device 200 may be provided with the deaeration unit 62. In a case where the deaeration unit 62 is provided, gas dissolved in the ejection material in the ejection material server bottle 60 can be removed by the deaeration unit 62. The pump 61 is not limited to a pump as long as it has the function of a liquid delivery unit. A liquid delivery unit suitable for the filling device 200 can be selected.

The intermembrane pressure regulation device 66 is a device capable of pressure regulation. The intermembrane pressure regulation device 66 comprises a pressure regulation mechanism such as a vacuum pump. The intermembrane pressure regulation device 66 can control the pressure regulation mechanism and suck air from the intermembrane space 8. The intermembrane pressure regulation device 66 also comprises, as the connecting unit, a coupler having a sealing mechanism that is sealed upon detachment. The intermembrane pressure regulation device 66 may be detachably connected to the coupler of the intermembrane exhaust pipe 7.

The intermembrane pressure regulation device 66 further comprises an interface unit configured to accept operation. The intermembrane pressure regulation device 66 regulates the pressure of the intermembrane space 8 according to operation accepted via the interface unit. For example, the interface unit is a connector connectable to a control device such as a computer or an operation unit such as a button or handle operated by a user.

[Filling Method of Ejection Material]

Next, preparation for filling the ejection material into the storage container 13 of the ejecting device 10 by the filling device 200 will be described. A predetermined jig (not shown) is used to fill the second storage space 6 with a predetermined amount of hydraulic fluid through the hydraulic fluid pipes 11 and 12. After the filling, the valves 53 and 54 provided in the hydraulic fluid pipes 11 and 12 are closed. At this stage, the first storage space 5 is vacant. That is, air exists in the first storage space 5 and either of the valves 51 and 52 is opened.

Next, the pipes 43 and 44 of the filling device 200 are connected to the filling pipes 3 and 4 of the ejecting device 10 such that the ejection material delivered from the ejection material server bottle 60 passes in the order of the deaeration unit 62, the particle filter 63, and the particle counter 64.

The filling pipes 3 and 4 may comprise, as the connecting units, couplers each having a sealing mechanism that is sealed upon detachment. In this case, the pipes 43 and 44 may also comprise similar couplers as the connecting units such that the storage container 13 and the filling device 200 are detachably connected to each other via the respective couplers. The couplers each having a sealing mechanism may be provided instead of the valves 51 and 52.

The ejection material server bottle 60 is supplied with a predetermined amount of ejection material to be filled into the first storage space 5. The ejection material server bottle 60 is a tank storing the ejection material to be filled. The ejection material server bottle 60 is arranged such that the liquid surface of the ejection material stored in the ejection material server bottle 60 is lower than the ejection head 14 by several tens of mm More specifically, it is preferable that the liquid surface be lower than the ejection head 14 by 30 to 50 mm. By making the liquid surface in the ejection material server bottle 60 lower than the ejection opening 15, the pressure of the first storage space 5 can be lower than the atmospheric pressure and the meniscus in the ejection opening can be maintained, whereby the ejection material can be prevented from leaking from the ejection opening 15.

Next, the intermembrane pressure regulation device 66 is connected to the intermembrane exhaust pipe 7, the valve 55 is opened, and the intermembrane pressure regulation device 66 regulates the pressure of the intermembrane space 8 to a first pressure that is equal to or lower than the pressures of the first storage space 5 and the second storage space 6. It is preferable that the pressure of the intermembrane space 8 be regulated and maintained so as not to limit the movement of the two films, the first film 1 and the second film 2. The first pressure is preferably lower than the atmospheric pressure by 3 to 6 kPa.

Next, the procedure of filling the ejection material into the ejecting device 10 by the filling device 200 will be described. The filling of the ejection material is performed after the preparation described above. During the filling of the ejection material, the ejection surface of the ejection head 14 is capped with a head cap 70 that is a cap member in order to prevent leaking of the ejection material from the ejection opening 15 provided in the ejection head 14 due to pressurization or impact at the time of filling.

After the valves 51 and 52 are opened, the pump 61 is driven and the ejection material in the ejection material server bottle 60 is filled into the first storage space 5. The amount of ejection material to be filled into the first storage space 5 is controlled by the hydraulic fluid filled in the preparation. The air in the first storage space 5 is exhausted from an atmosphere opening 65 provided in the ejection material server bottle 60.

Even after the predetermined amount of ejection material is filled into the first storage space 5, the pump 61 is continuously driven to circulate the ejection material in the direction of arrow A in FIG. 6. As shown in FIG. 6, the ejection material flows from below (−Z direction) to above (Z direction) in the vertical direction of the first storage space 5. Since the ejection material thus flows, even in a case where a bubble is generated during filling, the bubble is moved from below to above by buoyancy and therefore can be easily purged from the circulation path.

The particle counter 64 detects and counts particles in the circulating ejection material. The ejection material is circulated and filtered through the particle filter 63 until the count value of the number of particles counted by the particle counter 64 becomes equal to or less than a predetermined value. In a case where the count value of particles in the ejection material detected by the particle counter 64 becomes equal to or less than the predetermined value, the circulation of the ejection material is stopped and the valves 51, 52, and 55 are closed.

A time required for circulation of the ejection material for removal of particles is often predictable. In this case, after the filling of the ejection material, the filling device may circulate the ejection material for a predetermined time required for removal of particles included in the ejection material. Thus, the particle counter 64 may be omitted from the filling device.

During the filling of the ejection material, the pressure of the intermembrane space 8 is regulated to a pressure equal to or lower than the pressures of the first storage space 5 and the second storage space 6. By closing the valve 55 in this state, the intermembrane space 8 can be maintained at the first pressure equal to or lower than the pressures of the first storage space 5 and the second storage space 6. Accordingly, in the case of delivering the ejecting device 10 after the filling of the ejection material, the expansion of the intermembrane space 8 can be prevented during storage or conveyance of the ejecting device 10.

The intermembrane pressure regulation device 66 does not need to be operated consistently during the filling of the ejection material to regulate the pressure of the intermembrane space 8 to the first pressure, and may be intermittently operated. The intermembrane pressure regulation device 66 may stop the operation for regulating the pressure of the intermembrane space 8 during the filling of the ejection material. For example, the intermembrane pressure regulation device 66 may stop the operation in a case where the valve 55 is closed after the pressure of the intermembrane space 8 is regulated to the first pressure. That is, it is only necessary that a period during which the ejection material is being filled includes at least a period during which the intermembrane pressure regulation device 66 regulates the pressure of the intermembrane space 8 to the first pressure.

Instead of starting operating the intermembrane pressure regulation device 66 at the stage of preparation for filling, the intermembrane pressure regulation device 66 may be activated at the start of filling of the ejection material and operated during the filling to regulate the pressure of the intermembrane space to the first pressure. Also in this case, the intermembrane pressure regulation device 66 does not need to be operated consistently during the filling. It is only necessary that a period during which the ejection material is being filled includes at least a period during which the intermembrane pressure regulation device 66 regulates the pressure of the intermembrane space 8 to the first pressure.

The intermembrane pressure regulation device 66 may comprise a pressure sensing unit such as a pressure sensor capable of pressure measurement. The pressure of the intermembrane space 8 may be monitored by the pressure sensing unit and an appropriate threshold of the pressure of the intermembrane space 8 may be set such that in a case where the pressure of the intermembrane space 8 is out of the threshold, the intermembrane pressure regulation device 66 is operated and the pressure of the intermembrane space 8 is controlled to fall within the threshold.

Alternatively, in the preparation, the valve 55 may be closed after the pressure of the intermembrane space 8 is regulated to the first pressure equal to or lower than the set pressures of the first storage space 5 and the second storage space 6 by using the intermembrane pressure regulation device 66 and before the ejection material is filled into the ejecting device 10. The expansion of the intermembrane space 8 can be prevented without driving the intermembrane pressure regulation device 66 during the filling of the ejection material. That is, the intermembrane pressure regulation device 66 can prevent the expansion of the intermembrane space 8 by regulating the pressure of the intermembrane space 8 to the first pressure at least either before or during the filling of the ejection material into the first storage space 5.

In the filling device 200, a leakage liquid sensor may be provided below the intermembrane exhaust pipe 7 communicating with the intermembrane space 8. Even in a case where either the first film 1 or the second film 2 is broken, a leakage liquid from the broken portion can be guided to the leakage liquid sensor and detected. Alternatively, the intermembrane exhaust pipe 7 may be connected to a leakage liquid tank.

As described above, according to the present embodiment, the volume of the first storage space 5 storing the ejection material is not reduced even during the filling of the ejection material. Thus, a desired amount of ejection material can be filled. Further, according to the present embodiment, the ejection material in the container can be circulated and filtered even after the filling of the ejection material. Therefore, the ejecting device can be filled with the ejection material free from impurities such as particles.

The storage container 13 may comprise a pressure regulation mechanism configured to regulate the pressure of the intermembrane space 8 such as a pump and the intermembrane pressure regulation device 66 may control drive of the pressure regulation mechanism. Also in this case, the pressure of the intermembrane space 8 can be regulated to the first pressure via the pressure regulation mechanism.

In the present embodiment, the intermembrane pressure regulation device 66 and the filling device 200 are separate devices. However, the filling device 200 may comprise a pressure regulation unit having the function of the intermembrane pressure regulation device 66.

The ejection material storage unit 100 is often delivered for filling with the pressure of the intermembrane space 8 kept more negative than the atmospheric pressure. In this case, the ejection material may be filled without the use of the intermembrane pressure regulation device 66. Similarly, the pressure regulation unit may be omitted from the filling device 200.

Second Embodiment

In the present embodiment, as a method of adjusting the size of the intermembrane space 8, a pressure regulation unit configured to regulate the pressures of the first storage space 5 and the second storage space 6 will be described. The difference between the present embodiment and the first embodiment will be mainly described and the description of the same portions as the first embodiment will be omitted.

The filling device 200 of the present embodiment comprises a pressure regulation unit configured to slightly pressurize the first storage space 5 and the second storage space 6 during the filling of the ejection material and make the pressure of the first storage space 5 and the pressure of the second storage space 6 more positive than the atmospheric pressure. The intermembrane space 8 of the present embodiment is opened to the atmosphere. Since the pressure of the intermembrane space 8 is more negative than both of the pressures of the first storage space 5 and the second storage space 6, the intermembrane space 8 is prevented from being expanded. A desired amount of ejection material can be filled by regulating the pressures of the first storage space 5 and the second storage space 6 using the pressure regulation unit of the present embodiment.

At this time, the pressures of the first storage space 5, the second storage space 6, and the intermembrane space 8 are in the following relationship: the pressure of the first storage space 5≥the pressure of the second storage space 6≥the pressure of the intermembrane space 8. The pressure of the first storage space 5≥the pressure of the second storage space 6 so as to suppress reduction in the volume of the first storage space 5 and the filling amount of ejection material during the filling of the ejection material.

Before the pressure regulation unit of the present embodiment regulates the pressures of the first storage space 5 and the second storage space 6, the ejection surface of the ejection head 14 is capped with the head cap 70 that is a cap unit. In the present embodiment, since the pressure of the first storage space 5 is more positive than the atmospheric pressure, the ejection material may be accumulated between the ejection head 14 and the head cap 70 in the case of filling the ejection material using the filling device 200. Thus, the head cap 70 may comprise piping and a valve. In the case of filling the ejection material using the head cap comprising the piping and valve and the filling device of the present embodiment, the valve is closed during the filling of the ejection material so as not to discharge the ejection material. After the completion of filling and filtering, the valve may be opened to discharge the ejection material accumulated between the ejection head 14 and the head cap 70 through the piping.

In a case where the filling and filtering of the ejection material are completed, after regulating the pressure of the intermembrane space 8 to a pressure more negative than the atmospheric pressure, the pressure regulation unit regulates the pressures of the first storage space 5 and the second storage space 6 to a predetermined pressure that is more negative than the atmospheric pressure and more positive than the pressure of the intermembrane space 8.

As described above, according to the present embodiment, the volume of the first storage space 5 storing the ejection material is not reduced even during the filling of the ejection material. Therefore, a desired amount of ejection material can be filled.

Provided that the pressure of the first storage space 5≥the pressure of the second storage space 6≥the pressure of the intermembrane space 8, the pressure of the intermembrane space 8 may be regulated to a pressure more positive than the atmospheric pressure. For example, provided that the pressure of the first storage space 5≥the pressure of the second storage space 6≥the pressure of the intermembrane space 8, the intermembrane space 8 may be pressurized by a device capable of pressurization by dry air or the like to set the pressure of the intermembrane space 8 to a pressure more positive than the atmospheric pressure and then the filling device 200 may fill the ejection material.

Other Embodiments

The filling device 200 of the embodiments described above fills the ejection material into the ejection material ejecting device comprising the storage container with the two flexible films. The filling device 200 may fill the ejection material into an ejection material ejecting device comprising a storage container with only one flexible membrane or comprising a storage container without any flexible membrane.

The ejection material ejecting device of the embodiments described above is applicable to apparatus such as a printer, a copier, a facsimile with a communication system, and a word processor with a printer unit, and an industrial recording apparatus obtained by combining various processing devices. For example, the ejection material ejecting device may be used for biochip manufacture or electronic circuit printing. The ejection material ejecting device is also applicable to an apparatus configured to eject the ejection material and then planarize the ejected ejection material using a planar mold.

According to the technique of this disclosure, the ejection material can be appropriately filled into the ejection material storage container of the ejection material ejecting device.

Embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2019-085561 filed Apr. 26, 2019, which is hereby incorporated by reference wherein in its entirety.

What is claimed is:

1. An ejection material filling device configured to fill an ejection material into a first storage space of an ejection material ejecting device, the ejection material ejecting device comprising an ejection head comprising an ejection opening configured to eject the ejection material and a storage container comprising an internal space separated into the first storage space storing the ejection material and being covered with a first film and a second storage space storing a hydraulic fluid and being covered with a second film, an intermembrane space being located between the first film and the second film, the ejection material filling device comprising:
   a tank storing the ejection material to be filled into the first storage space;
   one or more pipes configured to form a circulation path including the tank and the first storage space;
   a liquid delivery unit configured to circulate the ejection material through the circulation path;
   a pressure regulation unit in communication with the intermembrane space and configured to regulate a pressure of the intermembrane space; and
   a filter provided in the circulation path.

2. The ejection material filling device according to claim 1, further comprising a counter configured to count particles included in the ejection material,
   wherein after the ejection material is filled into the first storage space, the ejection material is circulated through the circulation path until a count value in the counter becomes equal to or less than a predetermined value.

3. The ejection material filling device according to claim 1, further comprising a deaeration unit configured to degas the ejection material.

4. The ejection material filling device according to claim 1, wherein
   a liquid surface in the tank is located vertically below a surface of the ejection head comprising the ejection opening.

5. The ejection material filling device according to claim 1, wherein
   the ejection material is filled into the first storage space after the pressure regulation unit regulates the pressure of the intermembrane space to a first pressure that is equal to or lower than a pressure of the first storage space and equal to or lower than a pressure of the second storage space.

6. The ejection material filling device according to claim 1, wherein
   a period during which the ejection material is being filled into the first storage space includes at least a period during which the pressure regulation unit regulates the pressure of the intermembrane space to a first pressure that is equal to or lower than a pressure of the first storage space and equal to or lower than a pressure of the second storage space.

7. The ejection material filling device according to claim 5, wherein
   the ejection material is filled into the first storage space after the pressure of the intermembrane space is regulated to the first pressure and the intermembrane space is sealed by a sealing unit configured to seal the intermembrane space.

8. The ejection material filling device according to claim 5, wherein
   the first pressure is a pressure lower than the atmospheric pressure by 3 to 6 kPa.

9. The ejection material filling device according to claim 1, wherein
   the ejection material filling device further comprises a further pressure regulation unit configured to regulate pressures of the first storage space and the second storage space, and
   the further pressure regulation unit regulates the pressures of the first storage space and the second storage space to a predetermined pressure that is more positive than the atmospheric pressure in a case where the intermembrane space is opened to the atmosphere during filling of the ejection material.

10. The ejection material filling device according to claim 9, wherein
    the pressures are regulated to the predetermined pressure after a surface of the ejection head comprising the ejection opening is capped with a cap unit.

11. The ejection material filling device according to claim 1, wherein
    the ejection material ejecting device is an ejection material ejecting device provided in an imprint apparatus configured to perform imprint processing of transferring a pattern of a mold to a resist applied to a substrate, and
    the ejection material is the resist.

12. The ejection material filling device according to claim 1, wherein the pressure regulation unit comprises a vacuum pump.

13. The ejection material filling device according to claim 1, wherein the pressure regulation unit is detachably attachable to an intermembrane exhaust pipe communicating with the intermembrane space.

14. A pressure regulation device configured to regulate pressure, the pressure regulation device comprising
a regulation unit in communication with an intermembrane space and configured to regulate a pressure of the intermembrane space at least one of before and during filling of an ejection material into a first storage space of an ejection material ejecting device, the ejection material ejecting device comprising an ejection head comprising an ejection opening configured to eject the ejection material and a storage container comprising an internal space separated into the first storage space and a second storage space, the first storage space storing the ejection material to be supplied to the ejection head and being covered with a first film, the second storage space storing a hydraulic fluid and being covered with a second film, the intermembrane space being located between the first film and the second film.

15. The pressure regulation device according to claim 14, wherein
the regulation unit regulates the pressure of the intermembrane space to a pressure that is equal to or lower than a pressure of the first storage space and equal to or lower than a pressure of the second storage space.

16. The pressure regulation device according to claim 14, further comprising a connecting unit configured to communicate with the intermembrane space, the connecting unit comprising a sealing mechanism.

17. The pressure regulation device according to claim 14, wherein
the regulation unit comprises a pressure regulation mechanism configured to regulate the pressure of the intermembrane space and controls drive of the pressure regulation mechanism.

18. The pressure regulation device according to claim 14, wherein
the ejection material ejecting device comprises a pressure regulation mechanism configured to regulate the pressure of the intermembrane space, and
the regulation unit controls drive of the pressure regulation mechanism.

19. A method of filling an ejection material into a first storage space of an ejection material ejecting device, the ejection material ejecting device comprising an ejection head comprising an ejection opening configured to eject the ejection material and a storage container comprising an internal space separated into the first storage space and a second storage space, the first storage space storing the ejection material to be supplied to the ejection head and being covered with a first film, the second storage space storing a hydraulic fluid and being covered with a second film, an intermembrane space being located between the first film and the second film,
the method comprising regulating a pressure of the intermembrane space to a first pressure that is equal to or lower than a pressure in the first storage space and equal to or lower than a pressure in the second storage space, wherein the pressure of the intermembrane space is regulated by a pressure regulation unit in communication with the intermembrane space.

20. The method of filling an ejection material according to claim 19, wherein the ejection material is filled into the first storage space after the pressure of the intermembrane space is regulated to the first pressure and the intermembrane space is sealed by a sealing unit configured to seal the intermembrane space.

21. The method of filling an ejection material according to claim 19, wherein the first pressure is a pressure lower than the atmospheric pressure by 3 to 6 kPa.

* * * * *